United States Patent [19]

Einzinger et al.

[11] Patent Number: 5,029,322
[45] Date of Patent: Jul. 2, 1991

[54] POWER MOSFET WITH CURRENT-MONITORING

[75] Inventors: Josef Einzinger, Unterschleissheim; Ludwig Leipold, Munich; Jenoe Tihanyi, Munich; Roland Weber, Munich, all of Fed. Rep. of Germany

[73] Assignee: Siemens Aktiengesellschaft, Berlin and Munich, Fed. Rep. of Germany

[21] Appl. No.: 119,354

[22] Filed: Nov. 10, 1987

[30] Foreign Application Priority Data

Nov. 17, 1986 [DE] Fed. Rep. of Germany ....... 3639236

[51] Int. Cl.⁵ ............................................. H01L 23/56
[52] U.S. Cl. ......................................... 357/41; 357/75
[58] Field of Search .................... 357/23.1, 23.4, 23.8, 357/49, 75, 80, 41

[56] References Cited
FOREIGN PATENT DOCUMENTS 57-15452  1/1982  Japan ..................................... 357/75
60-117763  6/1985  Japan ..................................... 357/75
60-250639 12/1985  Japan ..................................... 357/75

OTHER PUBLICATIONS

Publication from Electronic Design entitled, "MOSFET Measures Current with No Loss" by Frank Goodenough; dated Feb. 20, 1986; pp. 59-60.

Primary Examiner—William D. Larkins
Attorney, Agent, or Firm—Jeffrey P. Morris

[57] ABSTRACT

A power MOSFET composed of a plurality of individual MOSFETs connected in parallel, wherein an additional sensing MOSFET monitors the current in the power MOSFET. The sensing MOSFET has a surface comparatively smaller than the power MOSFET and is connected in parallel with the power MOSFET with a resistor between the source of the power MOSFET and the source of the sensing MOSFET. The sensing MOSFET and resistor are integrated with an integrated circuit provided for the control of the power MOSFET.

4 Claims, 1 Drawing Sheet

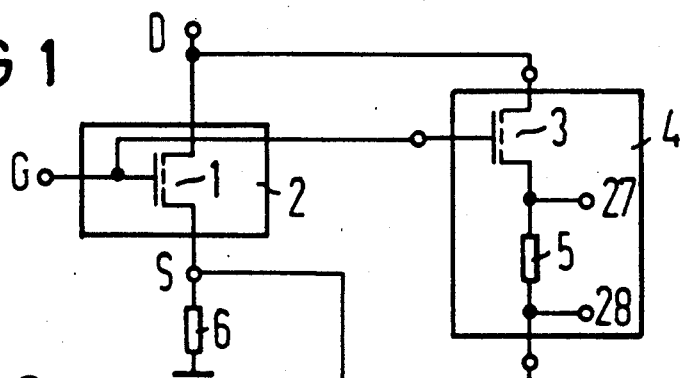
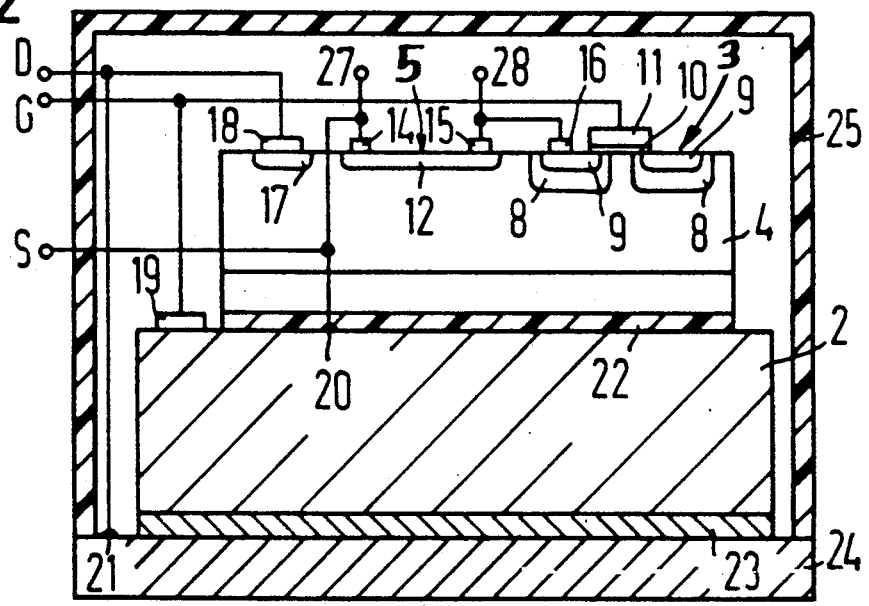
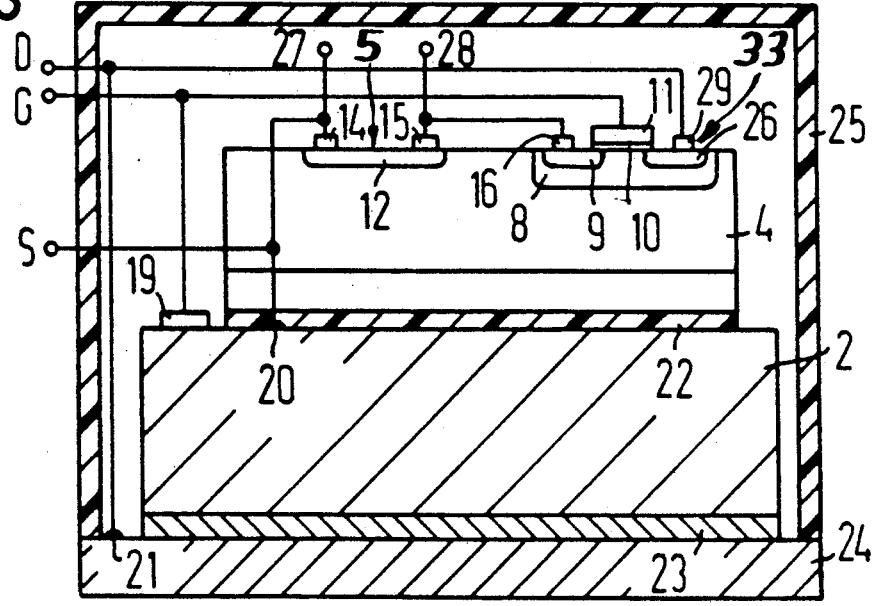

POWER MOSFET WITH CURRENT-MONITORING

BACKGROUND

1. Field of the Invention

This invention relates to a power MOSFET made up of a plurality of individual MOSFET's connected in parallel, and more particularly to a power MOSFET of this type including a sensing MOSFET coupled in parallel with the power MOSFET, wherein a resistor is coupled between the source of the sensing MOSFET and the source of the power MOSFET.

2. Background of the Invention

A MOSFET related to this type has been described in the Feb. 20, 1986 issue of Electronic Design at pages 59–60. The power MOSFET (transistor) consists of thousands of individual, tiny MOSFETs, all connected in parallel and all passing virtually equal currents through equal on-resistances. One or more of the individual MOSFETs are used as sense transistors which have their sources disconnected from those of the other MOSFETs and connected to a sense pin on the MOSFET package. Another pin (Kelvin pin) on the package is linked to the power MOSFET's source and a current sensing resistor is connected between the sense pin and Kelvin pin. The voltage across the resistor is a direct linear function of the current passing through the power transistor. This voltage thus can be used to monitor the current passing through the power transistor. Since only a very small fraction of the power transistor current is used for such monitoring, the power loss produced in the resistor is relatively small.

The above-described power MOSFET requires a different design from that of a regular power MOSFET that otherwise has the same electrical properties, and this different design requires additional cost.

SUMMARY OF THE INVENTION

It is, therefore, an object of this invention to monitor the current in a power MOSFET of the type described by using a more simple device configuration. Accordingly, this invention provides for a device comprising a power MOSFET of the type including a plurality of individual MOSFETs coupled in parallel, an integrated circuit including at least one sensing MOSFET, and a resistor coupled in series between the source of the sensing MOSFET and the source of the power MOSFET. The power MOSFET includes a first semiconductor body defining a first surface, and the sensing MOSFET includes a second semiconductor body which defines a second surface that is small in comparison with the first surface of the first semiconductor body, wherein the second semiconductor body is separated from the first semiconductor body. The sensing MOSFET is coupled in parallel with the power MOSFET and the resistor and sensing MOSFET are integrated with the second semiconductor body.

The device can also include means, such as an insulating bonding material, for mounting the first semiconductor body to the second semiconductor body, wherein the means is fixed to the first surface and the second surface. Additionally, the device can include a housing wherein both semiconductor bodies are arranged within the housing and the resistor is coupled in series between the source of the sensing MOSFET and the source of the power MOSFET within the housing.

Various other objects and advantages of the present invention will become apparent from the following description, with reference to the accompanying drawings.

BRIEF DESCRIPTION OF THE DRAWINGS

FIG. 1 is a schematic of the basic circuit in accordance with the invention;

FIG. 2 is a cross-sectional view through a power MOSFET and sensing MOSFET in accordance with a first embodiment of the invention; and FIG. 3 is a cross-sectional view through a power MOSFET and sensing MOSFET in accordance with a second embodiment of the invention.

DETAILED DESCRIPTION OF THE PREFERRED EMBODIMENT

In FIG. 1, the power MOSFET is designated by the numeral 1. It has a source terminal S, a drain terminal D and a gate terminal G. The power MOSFET is a component part of a semiconductor body 2 and is represented by a simplified symbol. An additional (sensing) MOSFET 3 is coupled in parallel to the source-drain segment of the power MOSFET 1 and a resistor 5 is coupled in series with the source of the power MOSFET 1 and the source of the sensing MOSFET 3. The gate terminals of the two MOSFETs 1, 3 are linked together. The sensing MOSFET 3 and the resistor 5 are integrated with a semiconductor body 4. The MOSFET 3 and the resistor 5 are likewise represented by a simplified symbol. The sensing MOSFET 3 has a substantially smaller surface than the power MOSFET 1. The surface of the MOSFET 3 may be between one thousandth and two thousandths of the surfaces of the power MOSFET 1. When the additional MOSFET 3 is identical in structure with the individual MOSFETs that make up the power MOSFET 1, the additional MOSFET 3 has from one thousandth to two thousandths the amount of current passing through it that flows through the power MOSFET 1. A load 6 is connected source-side and in series to the power MOSFET 1.

For the purpose of monitoring the current flowing through the power MOSFET 1, the voltage across the resistor 5 is monitored at two clamp-type terminals 27, 28 and can be conducted to a device such as voltage regulator. When a predetermined voltage is exceeded, the regulator can then adjust the gate-source bias voltage of the power MOSFET 1 in such a way that the voltage at the resistor 5, and therewith the current flowing through the MOSFET 1, will drop. The regulator is, to best advantage, also integrated with the semiconductor body 4. The semiconductor body 4 can also contain further integrated circuit arrangements for functions such as monitoring the temperature of the power MOSFET, monitoring loss of load, or monitoring overvoltage, etc. Instead of the regulator, there may also be a simple voltage indicating device.

The sensing MOSFET 3 does not necesssarily have to be identical in structure with one of the individual MOSFETs of the power MOSFET 1. Since it is a component part of an integrated circuit which requires other processing steps than a power MOSFET 1, the sensing MOSFET 3 will normally have a different design. The design of the sensing MOSFET 3 must be based on the consideration that because of the voltage drop at the resistor 5, its gate-source voltage is less than the gate-source voltage at the power MOSFET 1. Additionally, the MOSFET 3 and the resistor 5 must be designed in such a way that the voltage drop at the resistor 5 is of sufficient magnitude so that the monitoring arrangement or regulator connected to the clamp terminals 27, 28 can distinguish between normal operation and overload.

In the embodiment of the device in accordance with FIG. 2, the semiconductor body 4 is arranged on the semiconductor body 2 of the power MOSFET 1. The integrated circuit is represented in greatly simplified form. This embodiment of the power MOSFET operates in accordance with the circuit arrangement of FIG. 1.

Imbedded in the semiconductor body 4 are troughs 8 having a conductive type opposite from that of the semiconductor body 4. Imbedded in each of these troughs 8 is a source zone 9 having a conductive type opposite from that of the troughs 8. The source zone 9 is provided with a contact 16 and is partially covered with an insulating layer 10 upon which a gate electrode 11 is arranged. The trough 8 together with the source zone 9 and the gate electrode 11 and a portion of the semiconductor body 4 forms the additional MOSFET 3. This sensing MOSFET 3 acts as a vertical MOSFET.

Imbedded in the surface of the semiconductor body 4 is a resistance zone 12 having a conductive type opposite from that of the semiconductor body 4. The resistive zone 12 forms the resistor 5. The zone 12 is provided with contracts 14, 15 at its ends that are coupled with the clamp terminals 27, 28. The contact 15 is electrically coupled with the contact 16. Also imbedded in the surface of the semiconductor body 4 is a further zone 17 which is strongly doped, in comparison with the semiconductor body 4. It is in contact with an electrode 18. The semiconductor body 4 is bonded with the semiconductor body 2 of the power MOSFET 1 by means of an insulating layer 22 such as an insulating bonding material.

In the embodiment of the device in accordance with FIG. 3, the sensing MOSFET 33 is a lateral MOSFET. The drain zone 26 is imbedded in a trough 8 and coupled, via a contact 29, to the drain electrode 21 and drain terminal D. The zone 17 and contact 18 found in FIG. 2 are not required in the embodiment of FIG. 3, since the drain potential is coupled to the drain zone 26.

The semiconductor body 2 has a gate electrode 19 and a source electrode 20. The gate electrode 19 is coupled with lead to the gate electrode 11 of the MOSFET 3 and leads to a housing connection G. The source electrode 20 is coupled with the contact 14 and leads to a housing connection S. The semiconductor body 2 connected with a heat-conducting layer 23 to a metal base plate 24. The base plate 24 is provided with a drain electrode 21, to which the drain potential for the power MOSFET B is connected. The drain electrode 21 is connected with the electrode 18 and leads to a housing connection D.

In the two embodiments shown and described, the semiconductor body 4 of the control circuit has a smaller surface than the semiconductor body 2 and is arranged on one of the surfaces of the body 2. In the embodiments, the power MOSFET 1 control circuit and sensing MOSFET 3 are represented schematically and disposed within the housing 25. The leads connecting the semiconductor, bodies 2, 4 are located within the housing. The connections D, G and S are also shown schematically.

Various changes and modifications may be made without departing from the scope of the present invention. For example, the semiconductor body 4 can also be arranged spatially separated next to the semiconductor on the base plate 24. Additionally, the housing may have further connections for signal input to and output from the integrated control circuit.

We claim:

1. A device comprising:
    a first semiconductor body having a top surface and including a power MOSFET of the type having a plurality of individual MOSFETs coupled in parallel; and
    a second semiconductor body having a top surface wherein an integrated circuit for controlling the power MOSFET is formed, and wherein at least one sensing MOSFET, and a resistor are formed, the sensing MOSFET being coupled in series with the resistor, the sensing MOSFET and resistor being coupled in parallel with the power MOSFET the resistor being coupled in series between the source of the sensing MOSFET and the source of the power MOSFET.

2. The device of claim 1 further comprising means for mounting the second semiconductor body on the top surface of the first semiconductor body.

3. The device of claim 1 further comprising a housing wherein both semiconductor bodies are arranged within the housing and the resistor and sensing MOSFET are coupled in parallel with the power MOSFET by leads located within the housing.

4. The device of claim 2 further comprising a housing wherein both semiconductor bodies are arranged within the housing and the resistor and sensing MOSFET are coupled in parallel with the power MOSFET by leads located within the housing.

* * * * *